United States Patent
Katsunuma (10) Patent No.: US 11,443,954 B2
(45) Date of Patent: Sep. 13, 2022

(54) METHOD AND APPARATUS FOR CONTROLLING A SHAPE OF A PATTERN OVER A SUBSTRATE

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/709,430

(22) Filed: Dec. 10, 2019

(65) Prior Publication Data
US 2021/0175091 A1 Jun. 10, 2021

(51) Int. Cl.
*H01L 21/311* (2006.01)
*H01L 21/67* (2006.01)
*H01L 21/02* (2006.01)

(52) U.S. Cl.
CPC .. *H01L 21/31138* (2013.01); *H01L 21/02244* (2013.01); *H01L 21/31144* (2013.01); *H01L 21/67069* (2013.01)

(58) Field of Classification Search
CPC ................. H01L 21/31144; H01L 21/31056
See application file for complete search history.

(56) References Cited

U.S. PATENT DOCUMENTS

| | | | | |
|---|---|---|---|---|
| 2010/0240217 A1* | 9/2010 | Kushibiki | ......... | H01L 21/31122 438/694 |
| 2013/0299920 A1* | 11/2013 | Yin | ...................... | H01L 29/6653 257/408 |
| 2015/0361550 A1* | 12/2015 | Yabe | ................. | C23C 16/45551 438/782 |

FOREIGN PATENT DOCUMENTS

| | | |
|---|---|---|
| JP | 2009-049141 A | 3/2009 |
| JP | 2012-204668 A | 10/2012 |
| JP | 2015-012178 A | 1/2015 |

* cited by examiner

Primary Examiner — Thomas T Pham
(74) *Attorney, Agent, or Firm* — Xsensus LLP (57) ABSTRACT

An apparatus and method process a substrate in a first session and a second session. In the first session, a hybrid gas application cycle is performed in a chamber that holds the substrate. A first gas is introduced for a first time period so components of the first gas adsorb onto the substrate. Subsequently, a second gas is introduced for a second time period so the second gas reacts with the components of the first gas to provide a protective layer on sidewalls of a pattern of the substrate, and the second gas etches a bottom portion of the pattern, a ratio of the first time period to the second time period being a use-ratio. Then, in a second session, the hybrid gas application cycle is repeated with a different use-ratio that corresponds with a vertical dimension of the pattern.

18 Claims, 8 Drawing Sheets

METHOD AND APPARATUS FOR CONTROLLING A SHAPE OF A PATTERN OVER A SUBSTRATE

CROSS-REFERENCE TO RELATED APPLICATION

The present application contains subject matter related to that described in co-pending U.S. patent application Ser. No. 16/212,847, entitled "Method Of Etching Film And Plasma Processing Apparatus", filed on Dec. 7, 2018, the entire contents of which being incorporated by reference in its entirety.

TECHNICAL FIELD

The present disclosure relates to semiconductor manufacturing equipment and is generally directed to a method and an apparatus for processing substrates. More particularly, the disclosure relates to a semiconductor manufacturing device that employs processes such as Atomic Layer Deposition (ALD), Chemical Vapor Deposition (CVD) and Atomic Layer Etching (ALE) for controlling a shape of a pattern over a substrate.

BACKGROUND

Over time, semiconductor fabrication methods have improved with the introduction of new technologies, and as a consequence, the size of integrated circuits (ICs, microelectronic circuits, microchips, or simply "chips") fabricated as a single unit, as well as the feature sizes of components on the IC have also reduced. Miniaturized active and passive semiconductor devices, as well as interconnections are fabricated on a semiconductor substrate wafer (e.g., silicon). To form the ICs, the wafer is subjected to numerous processes, such as doping, ion implantation, etching, thin-film deposition of various materials, and photolithographic patterning. Finally, the individual microcircuits are separated by wafer dicing and then individually packaged as ICs.

Particular process steps employed in forming ICs on a substrate include Atomic Layer Deposition (ALD), Chemical Vapor Deposition (CVD) and Atomic Layer Etching (ALE).

SUMMARY

In an embodiment, an apparatus and method of processing a substrate execute a hybrid gas application cycle in a chamber. In a first session, a first gas is introduced for a first time period in the chamber so components of the first gas adsorb onto the substrate. subsequently, a second gas is introduced for a second time period so the second gas reacts with the components of the first gas to provide a protective layer on sidewalls of a pattern of the substrate and the second gas etches a bottom portion of the pattern, a ratio of the first time period to the second time period being a use-ratio. The hybrid gas application cycle is repeated while maintaining the use-ratio. In a second session, the hybrid gas application cycle is repeated with a different use-ratio that corresponds with a vertical dimension of the pattern.

The present disclosure was made in light of a recognition by the present inventor that conventional devices and methods do not change application time of an introduced precursor as a control on etch depth, with respect to application time of another gas during an etch operation. Moreover, aspect ratios (A/R) of patterns, e.g., holes, formed in the semiconductor manufacturing process continues to increase. For example, in the case of 3D NAND structures, the A/R can be as high as 45 or more. Though, it is desirable to form a hole at a precise position and in a uniform dimension, using conventional approaches the hole can exhibit a downward taper and/or bowing-out in certain regions of the hole, especially under the mask. In light of this challenge, the present inventor recognized a need for improving dimension control of high A/R patterns.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 2A to 2D illustrate how a pattern is formed on the substrate. In particular.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
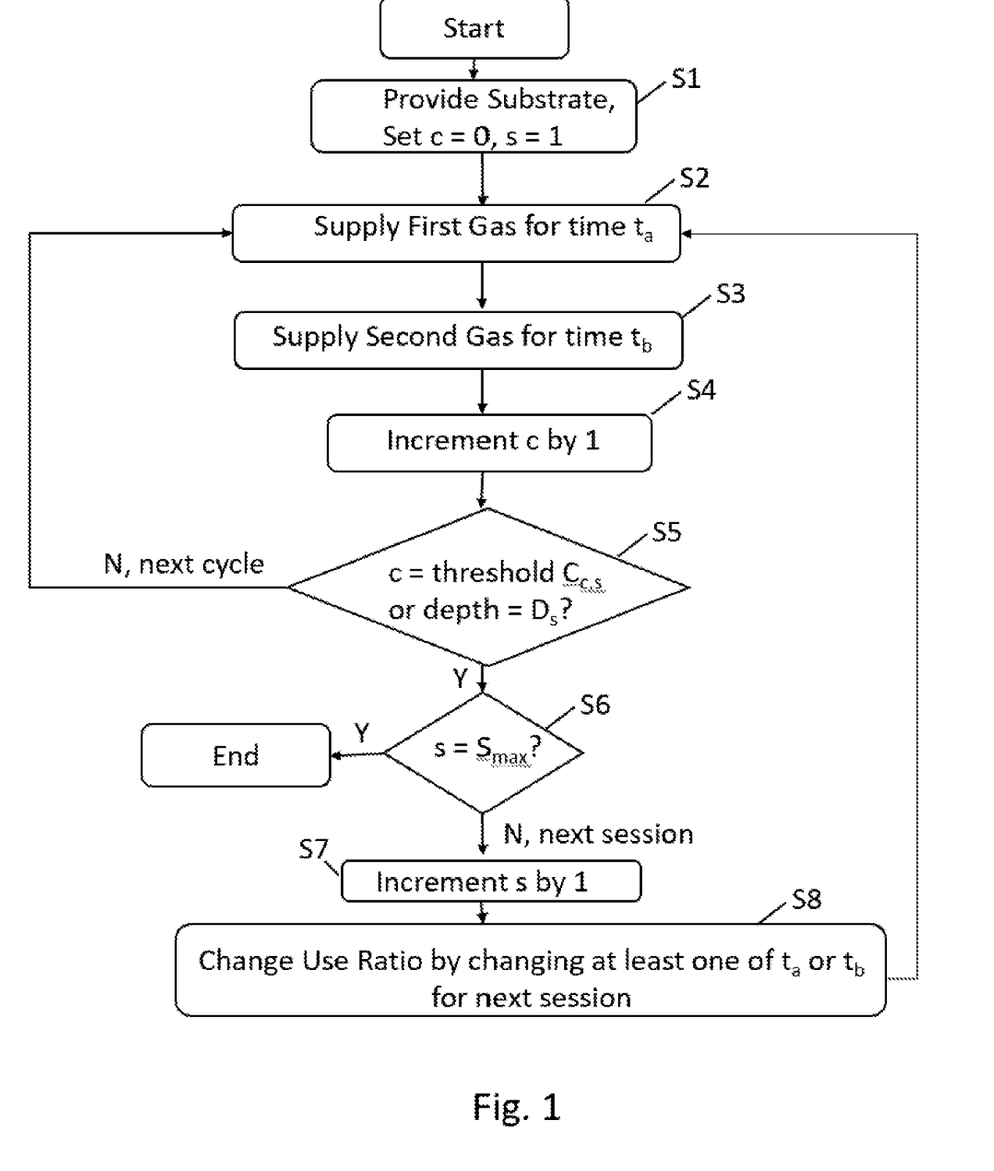
FIG. 1 is a flowchart illustrating a process flow for processing a substrate according to an embodiment.

FIG. 1 is a flowchart illustrating a process flow for processing a substrate according to an embodiment. At step S1, a substrate on which a pattern (e.g., a hole is formed in one or more layers) is formed is provided. For example, the substrate is transported into a chamber. In this embodiment one chamber is used, but different chambers can be used for steps S2 and S3. As will be discussed, a process according to the present embodiment performs multiple "hybrid gas application cycles" (application of a first gas followed by a second gas at a particular "use-ratio", where the second gas is applied either immediately the first gas, after some time delay, or after one or more intermediate steps is performed between the application of the first gas or second gas) per "session" (a set of multiple hybrid gas application cycles performed with a same use-ratio), so as to etch a hole to a first depth D1. Then the process performs at least a second session of multiple hybrid gas application cycles at a different "use-ratio" than that used in the first session so as to further etch the hole to a second depth D2. For clarity, while the present description uses examples of applying gas in steps S2 and S3, it should be understood that the teachings of the present disclosure apply equally well with the application of the gas components in plasma form in steps S2 and S3, as well as hybrid application of gas and/or plasma during all or portions of either or both of steps S2 and S3. It should be understood that the term "hybrid gas application cycles" includes the application of gas and/or plasma. In step S1, a cycle index, c, is initially set to 0, and a session index is initially set to 1. A "use ratio" is a ratio of application times of the first gas to the second gas during a cycle.

The process then proceeds to step S2, where an application of a first gas is applied to the chamber as a first part of a first hybrid gas application cycle. Moreover, in the step S2, a first gas, also referred to as a precursor, such as silicon-containing gas, is supplied into the chamber in which the substrate is placed. A precursor component, such as Si, which is a component of a Si-containing gas, of the first gas adsorbs onto substrate surfaces. For clarity, although Si is used as an exemplary precursor component in many places in this document, it should be understood that precursor components other than, or in addition to, Si are also intended as viable precursor components that adsorb to the substrate surfaces, such as the sidewalls. Moreover, the present teachings are not intended to be limited to Si as the only precursor component. The first gas is applied for a first time period, $t_a$.

The process then proceeds to step S3 (which is the second part of the hybrid gas application cycle), where a second gas of the first hybrid gas application cycle is supplied to the chamber for a time $t_b$. In the second step, the second gas, which may also be referred to as a reaction gas, such as an oxygen-containing gas (e.g., O* radical) is supplied into the chamber. Step S2 followed by step S3, constitutes a first cycle of a hybrid gas application cycle, and a consequence of performing step S3 of the first hybrid gas application cycle is that a protective layer is formed on the sidewall of the hole, while the bottom part of the hole is partially etched. In the case of step S2 using Si-containing gas as a precursor, and an O* radical as the gas for the step S3, the protective layer that forms on the sidewall of the hole is $SiO_2$.

The process proceeds to step S4, where the cycle index, c, is incremented by 1. Subsequently, a query is made in step S5 regarding whether the cycle index meets a threshold number, $C_{c,s}$, where "c" is the cycle index, and "s" is a session index. As an alternative decision metric, step S5 checks an etch depth for a particular session. For example, in reference to FIG. 4, $D_1$ corresponds to etch depth at the completion of Session 1. $D_2$ corresponds to the etch depth at the completion of Session 2, and $D_3$ corresponds to the etch depth at the end of Session 3. If the response to query in step S5 is negative, it means that more hybrid gas application cycles need to be performed as part of the first session. However, if the response to query in step S5 is affirmative, it means that the first session is completed, and then process proceeds to step S6.

Step S6 performs another query regarding whether the session index, s, has reached $S_{max}$, which, if affirmative, means all of the sessions are complete. However, if the session index, s, has not reached the maximum, the process proceeds to step S7 where the session index, s, is incremented by 1, and then the process proceeds to step S8.

In step S8 the use-ratio is changed as part of the next session, and the process returns to step S2, for another series of cycles performed at the new use-ratio, until that next session is completed. Ultimately the process ends when the query at step S6 affirms that session index, s, has reached $S_{max}$. It should be noted that the embodiment described with respect to FIG. 4 includes 3 sessions. However, as few as 2 sessions may be performed, or more than 3, such as 4 or more may be performed.

A consecutive application of step S2 followed by step S3 is a single cycle of a hybrid gas application cycle, which may be repeated a number of times in succession as part of a first session that uses a consistent use-ratio (ratio of $t_a$ to $t_b$). Moreover, the repeated application of steps S2 and S3 continue for a predetermined number of cycles, which corresponds with a depth of the formed pattern reaching a first predetermined depth D1 (see FIG. 4).

With respect to the use-ratio, a change in the relative percentage (or absolute times) of respective application times of the first and second gases is changed according to a desired effect on the width or depth of the hole between depth D1 and a deeper depth D2. Moreover, the present inventor recognized that by controlling the amount of time at step S2 relative to the time allocated to step S3, the size (critical dimension) and shape of the pattern may be reliably formed. As a particular example, as part of a single hybrid gas application cycle, step S2 may be applied for 15 seconds, followed by step S3 for 10 seconds, and then this particular hybrid gas application cycle may be repeated another 7 times until depth D2 is achieved. This repeated application of 8 single hybrid gas application cycles in a row may be referred to a first hybrid gas session, or simply "first session". Then, in a second (and next) hybrid gas session, the use-ratio is changed relative to that used in the first hybrid gas session.

The present inventor recognized that application of the first gas in step S2 for a longer percentage (higher use-ratio) will tend to provide a relatively thicker $SiO_2$ protective layer at sidewalls of an upper portion (nearer the mask) of the hole, thus preserving the integrity and verticality of that portion of the hole while the positive ions of the second gas in step S3 bombard the bottom part of the hole, thus increasing etch depth. In turn, by realizing the synergistic effects of repeating step S2 and step S3 for a predetermined number of cycles during a first hybrid gas session, a resultant hole will have a first characteristic shape to a predetermined depth. However, if a next section of the hole is intended to be biased toward a bowed profile, for example, as opposed to a straight or tapered portion, then the shape of the bow at the lower depth can be controlled by altering the use-ratio of step S2 to step S3. Altering the use-ratio to favor the amount of time the second gas at step S3 is applied means that the protection effect on the sidewalls due to the application of the first gas in step S2 for a shorter portion of a cycle can be reduced. In turn, this would result in a wider (bowed) portion starting at depth D2, where the protective effect on the sidewalls is lower.

FIGS. 2A to 2D illustrate a pattern formed on the substrate. Reference numeral 100 indicates an underlying layer such as $SiO_2$ layer formed on the substrate. Reference numeral 110 indicates a layer to be etched such as a Spin-On Carbon (SOC) layer. Reference numeral 120 indicates a mask layer such as a Si-containing Anti Reflective Coating (Si-ARC) layer. In the non-limiting examples of FIGS. 2B-2D, "S" stands for Silicon, or Silicon containing components, "P" stands for Positive ion, "O" stands for O radical. Once again, Si need not be the only adsorbed component, nor is it the exclusive component. Other components that contain Si, or are absent of Si may be used as well to line the sidewalls as a result of the adsorb process.

Figure 2A:
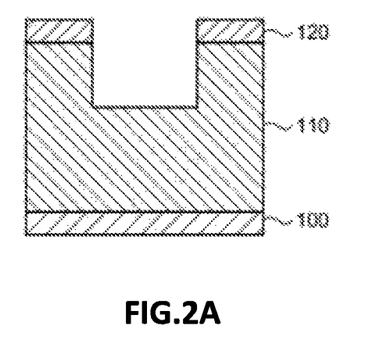
FIG. 2A depicts a substrate to be provided in step S1 of FIG. 1.

FIG. 2A depicts a substrate to be provided in step S1 of FIG. 1.

Figure 2B:
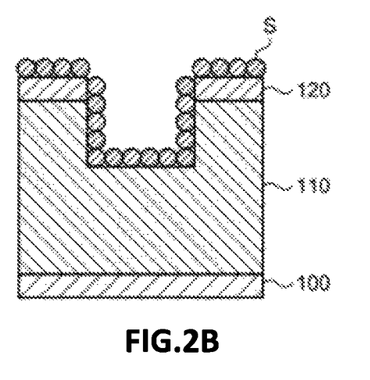
FIG. 2B depicts a substrate on which components of the first gas are adsorbed in step S2 of FIG. 1.

FIG. 2B depicts a substrate on which precursor components S of the first gas are adsorbed on surfaces of the mask layer 120, and the exposed portions of layer 110. FIG. 2B corresponds with step S2 in FIG. 1.

Figure 2C:
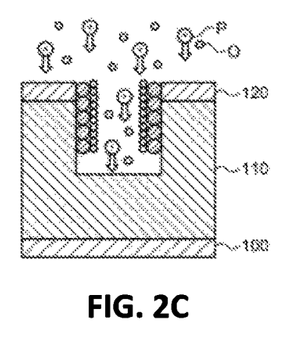
FIG. 2C depicts how the components of the second gas react with the adsorbed components of the first gas on the sidewall of the hole in step S3 of FIG. 1.

FIG. 2C depicts how the components of the second gas react with the adsorbed Si (or other components that are adsorbed based on the precursor gas and/or plasma) on the sidewall of the hole in step S3 of FIG. 1. In FIG. 2C, positive ions P are also indicated, which bombard and etch the bottom part of the hole to deepen the hole. Sidewalls are shown as being protected by an $SiO_2$ film formed from the Si precursor elements S (contributed from the first gas) combining with O* radical particles O (contributed from the second gas). As discussed above, the aspect ratio of the hole and the depth of the hole can be controlled via the number of iterations step S2 and step S3, and the applied use-ratio.

Figure 2D:
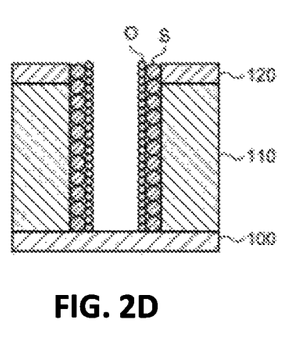
FIG. 2D depicts a substrate after all steps in FIG. 1 are performed.

FIG. 2D depicts a substrate after steps S2-S8 are performed, and a depth $D_3$ has been achieved. While the protective layer is formed on the sidewall, the bottom part is etched away. Owing to the protective film formed on the sidewall, the aspect ratio is managed well without excess taper or excess bowing.

Figure 3A:
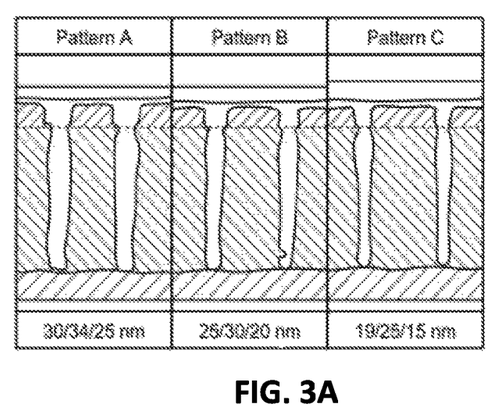
FIGS. 3A-3C illustrate results of experiments performed consistent with the present disclosure.
Figure 3B:
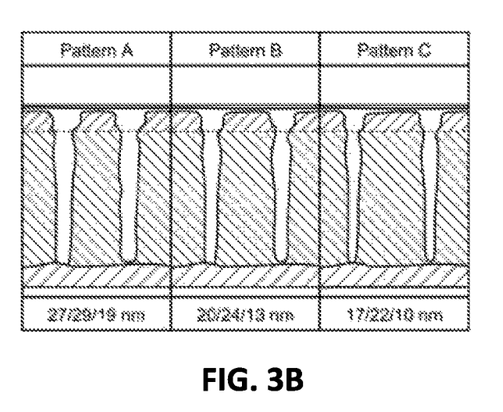
Figure 3C:
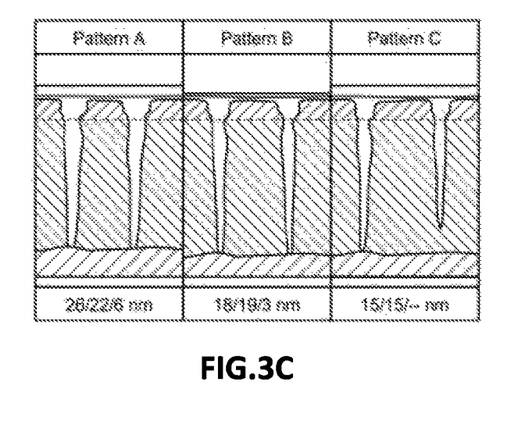

FIGS. 3A-3C correspond to SEM images and illustrate results of exemplary processes performed according to the procedures discussed above. FIG. 3A includes SEMs of three different patterns resulting from three different applications of the teachings of the present disclosure. In each of Patterns A, B, and C, step S2 (FIG. 1) was applied for 15 seconds and followed by step S3 (FIG. 1) for 10 seconds, such that the use-ratio is 15/10 (or 1.5) for a single hybrid gas application cycle. Then, 7 additional (a total of 8) hybrid gas application cycles are performed. For Pattern A, dimensions of the hole are described in terms of width at top/bow region/bottom (critical dimension), and thus 30/34/25, in units of nanometers, are provided at the bottom of the SEM. Additional examples are provided as Pattern B and Pattern C.

FIG. 3B is similar but the first gas in step S2 is applied for 15 seconds, and the second gas in step S3 was applied for 7.5 seconds (use-ratio of 15/7.5, or 2). A total of 11 hybrid gas application cycles were performed for each of Patterns A, B, and C.

FIG. 3C is another example where the first gas in step S2 is applied for 15 seconds, and the second gas in step S3 is applied for 5 seconds (use-ratio of 15/5, or 3). 17 cycles in total were performed. By controlling the frequency (or use-ratio) of step S2, it is possible to control the size (i.e., critical dimension) of the shape of the pattern. There is no limitation on the material of the layer to be etched or formed by the first and second gases.

The conditions for producing the results shown in FIGS. 3A-3C are now described. The length of the process time was set so that the total time of step S3, i.e., the etched amount, was approximately the same for each of the three scenarios. The experiment was performed based on the following conditions: in step S2 a Si-containing precursor (e.g., a gas mainly composed of aminosilane) was into the chamber at a pressure of 200 mTorr for 15 seconds at a flow rate of Si-containing precursor/Ar (Argon) to be 100/300 sccm. RF power applied to upper and lower electrodes of the chamber were 0 W and 0W respectively. Subsequently, an optional purge step is performed, where the purge step serves to purge the gas in the chamber with an Ar flow rate of 300 sccm for 10 seconds at a pressure of 0 mTorr and no RF power applied to the electrodes. In step S3, an oxygen-containing gas is introduced into the chamber at a chamber pressure of 20 mTorr with RF power applied to upper and lower electrodes at 0 W and 350 W (at 40 MHz) respectively for the times specified above with respect to FIGS. 3A-3C. The flow rate of $O_2$/COS (carbonyl sulfide) was set to 350/50 sccm respectively. This step served to form the protective layer and to etch the bottom of the pattern at the same time. The above is a suitable condition for etching the organic film, such as Spin-On Carbon (SOC).

The processing apparatus has two electrodes, one at the top and another at the bottom of the chamber. The upper and lower electrodes are applied radio frequencies whose values are applied at (60/40 MHz). Ar stands for Argon, and COS stands for Carbonyl Sulfide. The temperature of the chamber part is not specifically limited. However, the temperature of the lower part of the chamber best to not be too low. Approximately 40 degrees centigrade is suitable because the Si precursor does not adsorb well onto the substrate when the temperature of the lower part is low.

Figure 4:
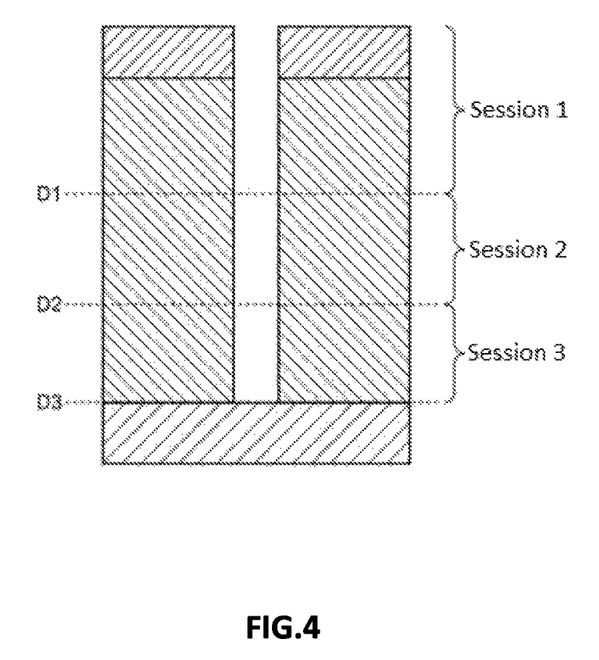
FIG. 4 is a diagram showing a resultant pattern in a substrate, showing which session corresponds to etch depth in the substrate.

FIG. 4 indicates how changes in the use-ratio of steps S2 and S3 (FIG. 1) are changed in Sessions 1, 2 and 3, to form etch depths of D1, D2 and D3 respectively.

Similar to what was shown with the SEMs of FIGS. 3A, 3B and 3C, FIG. 5A illustrates patterns obtained by performing the process according to the present embodiment. Chamber pressure, flow rates, temperature and other conditions are the same as those discussed above for FIGS. 3A-3C. However, in FIG. 5A the three patterns (A, B, and C) were formed with three sessions. The first session had 6 hybrid gas application cycles, with each cycle in session 1 having the gas in step S2 applied for 15 seconds and the gas in step S3 applied for 5 seconds. The thickness of the SOC layer was 200 nm. The second session had 4 hybrid gas application cycles with step S3 applied for 7.5 seconds. The third session had 3 cycles with step S3 applied for 10 seconds. The use-ratio varied from session 1 at 15/5 (or 3), session 2 at 15/7.5 (or 2), and session 3 at 15/10 (or 1.5). As a consequence, the top/center/bottom critical dimension are quite uniform.

Figure 5A:
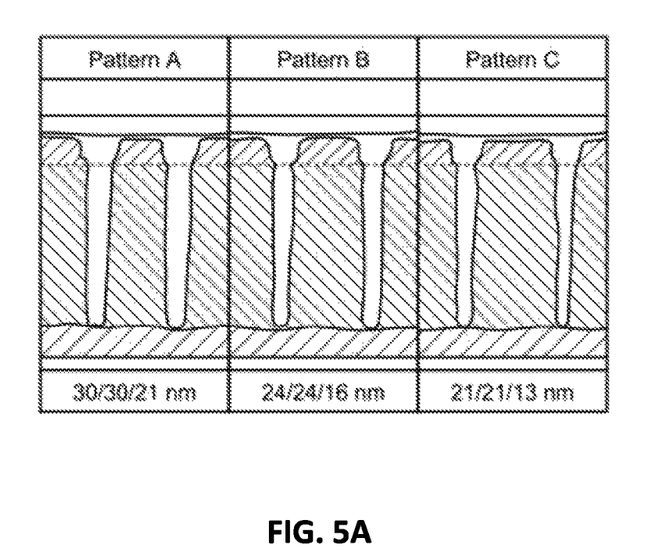
FIG. 5A illustrates patterns obtained by performing the process according to an embodiment.
Figure 5B:
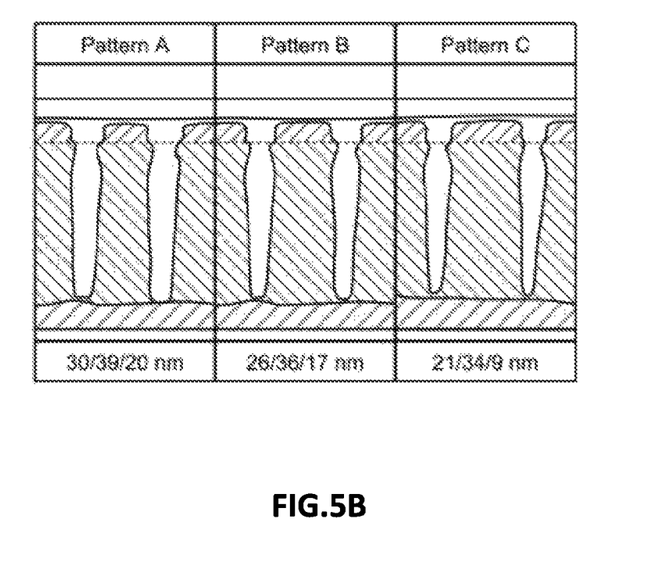
FIG. 5B illustrates patterns obtained by performing a process according to a conventional method.

In contrast, FIG. 5B illustrates patterns obtained by performing a process according to a conventional etch method. FIG. 5B corresponds to an SEM image. As can be seen from three patterns, each of the holes exhibits a significant bowing below the Si-ARC mask, and then has a pronounced taper at the bottom of the hole.

Figure 6:
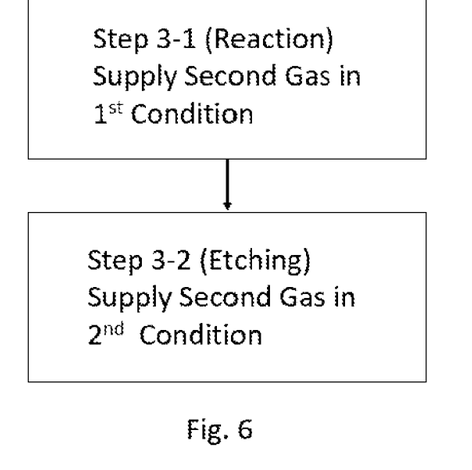
FIG. 6 illustrates a variation of step S3 of FIG. 1.

FIG. 6 illustrates a variation of step S3 of FIG. 1. In FIG. 2C, step S3 is illustrated as being performed in one step. However, step S3 can be divided into two steps, where the gases (or plasmas) used in steps S3-1 and S3-2 may be the same, or different. In the present embodiment of FIG. 6, for step S3-1, the $1^{st}$ condition may be set so that the second gas reacts mainly with the components on the sidewall. Alternatively, the conditions for the step S2 (FIG. 1) and step S3-1 may be set so as to realize "sub-conformal" ALD. The condition for step S3-2 is set so as to mainly etch the bottom part of the hole. In the embodiment of FIG. 6, the "use ratio" means the ratio of application time of the first gas in step S2 to the application time of (second) gas in step S3-2, i.e., etching. The application time of the second gas in step S3-1 is not a factor in use ratio for this embodiment.

Figure 7:
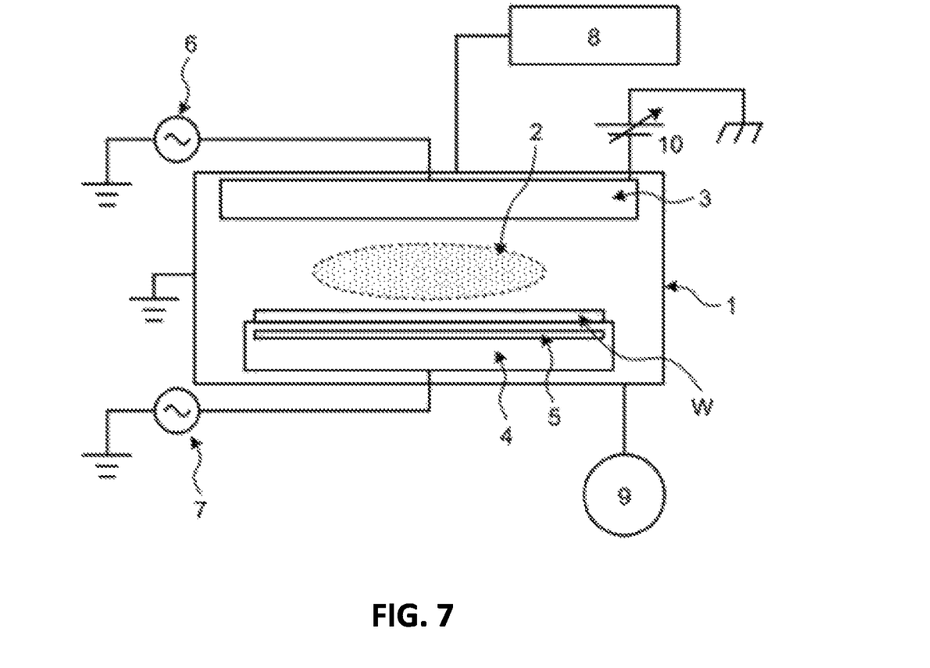
FIG. 7 is a schematic drawing of an apparatus utilizing capacitive-coupled plasma.

FIG. 7 illustrates a capacitive coupled plasma (CCP) type plasma system. The system of FIG. 7 includes a chamber 1, an upper electrode 3, and a lower electrode 4. RF power is coupled to the upper electrode 3 and the lower electrode 4 from RF sources 6 and 7. The power coupling may include differing RF frequencies 6, 7. The lower electrode 4 includes an electrostatic chuck (ESC) 5 to support and retain a substrate W. A gas source 8 is connected to the chamber 1 to supply process gases into the chamber 1. An exhaust device 9 such as a turbo molecular pump (TMP) is connected to the chamber 1 to evacuate the chamber 1. Plasma 2 is formed proximate the substrate W between the upper electrode 3 and the lower electrode 4 as the RF power is supplied to at least one of the upper electrode 3 and the lower electrode 4. Alternatively, multiple RF power sources 6, 7 may be coupled to the same electrode. Moreover, variable direct current (DC) power source 10 may be coupled to the upper electrode 3.

Figure 8:
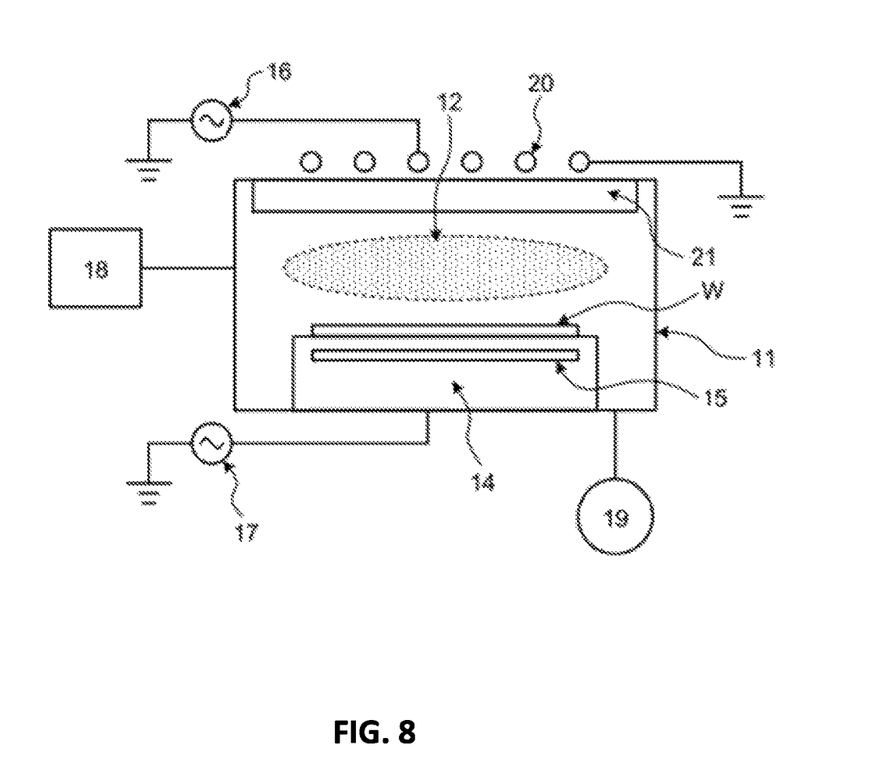
FIG. 8 is a schematic drawing of an apparatus utilizing inductively-coupled plasma.

FIG. 8 illustrates an inductively coupled plasma (ICP) type plasma system. The system includes a chamber 11, a dielectric window 21, and a lower electrode 14. An inductive element (coil) 20 is disposed above the dielectric window 21. RF power is coupled to the inductive element 20 and the lower electrode 14 from RF sources 16, 17. The power coupling may include differing RF frequencies 16, 17. The lower electrode 14 includes an electrostatic chuck (ESC) 15 to support and retain a substrate W. A gas source 18 is connected to the chamber 11 to supply process gases into the chamber 11. An exhaust device 19 such as a turbo molecular pump (TMP) is connected to the chamber 11 to evacuate the chamber 11. Plasma 12 is formed proximate the substrate W between the dielectric window 21 and the lower electrode 14 as the RF power is supplied to at least one of the dielectric window 21 and the lower electrode 14.

Figure 9:
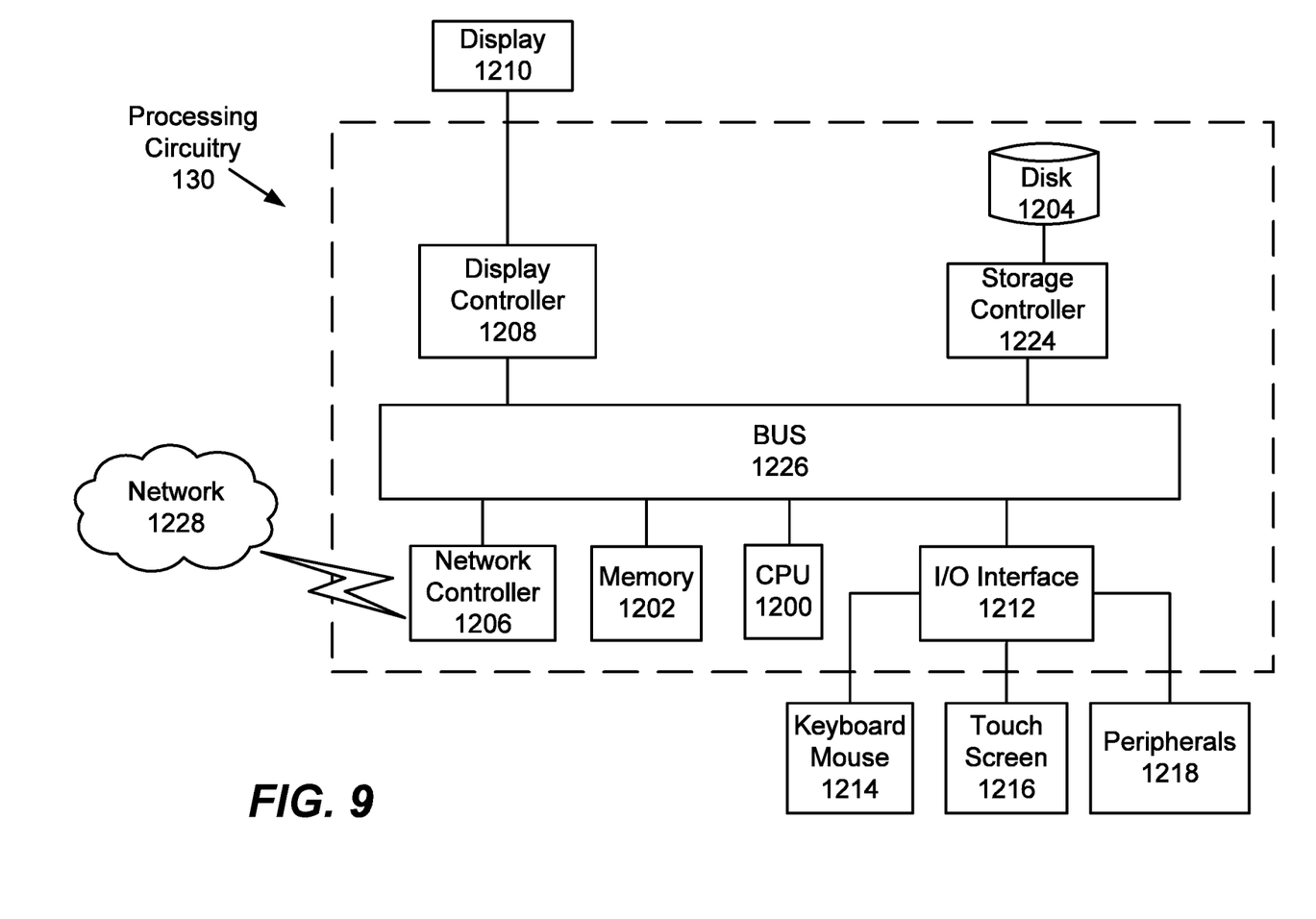
FIG. 9 is a block diagram of processing circuitry for performing computer-based operations described herein.

FIG. 9 illustrates control circuitry 130 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 9, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 9. A processing circuit also includes devices such as an application specific integrated circuit (ASIC) and conventional circuit components arranged to perform the recited functions.

In FIG. 9, the processing circuitry 130 includes a CPU 1200 which performs the processes described above. The processing circuitry 130 may be a general-purpose computer or a particular, special-purpose machine. In one embodiment, the processing circuitry 130 becomes a particular, special-purpose machine when the processor 1200 is programmed to perform backscattering elimination from fog via spatial and temporal modulations (and in particular, any of the processes discussed with reference to FIG. 3 and FIG. 11).

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 9 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The process of manufacturing a substrate with a high aspect ratio pattern, involves the improvement in the dimension control of the pattern formed. The process aims at controlling the size and the shape of a pattern, such as a hole, trench, line/space formed on the substrate. The example pattern is that of a hole. The process includes:

(a) Introducing a first gas (Si-containing precursor in the example) into a chamber to cause a component of the first gas to adsorb onto the surface of the substrate.

(b) Introducing a second gas ($O_2$ in the example) into the chamber to cause the second gas to react with the adsorbed Si precursor to form a protective layer on the sidewall of the hole, while the positive ions generated from the second gas directly bombard and etch the bottom part of the hole. The steps (a) and (b) are performed repeatedly in this order until the depth of the hole reaches a predetermined level.

During the process, when step (a) is favored in its use-ratio (in other words, when the time of step (b) is shortened with respect to the time of step (a)), the protective film on the sidewall can be thickened, and as a result, the sidewall remains more intact, which is advantageous for the prevention of bowing. When the (a) is performed at a less use-ratio (in other words, when the time of (b) is lengthened relative to the time of (a)), the formed protective film is thinner, and as a result, a lower portion of the sidewall is etched and the bottom of the hole becomes wider, which is advantageous when vertically straight sidewall is desired. By controlling the frequency of (a), control can be obtained over the size, i.e., critical dimension (CD) and the shape of the pattern. There is no limitation to the material of the layer to be etched or formed, the $1^{st}$ gas and the $2^{nd}$ gas. The combination is determined as appropriate.

A combination approach for precursor adsorption and etch for a carbon hard mask (CHM) uses cyclic precursor adsorption followed by organic film etch process containing O* radical. The approach etches organic film while protecting the sidewall with $SiO_2$ film.

The present disclosure describes the forming of a vertical hole without taper and bowing, or a controllable amount of taper and/or bowing. Using a conventional process, the hole usually tapers at the lower portion of the hole. Here, a SOC layer is etched while an Si-ARC layer serves as a mask. After the hole is formed in the SOC layer, an $SiO_2$ layer, which is thicker than is indicated below, is etched while the SOC layer serving as a mask. Thus, the A/R ratio can be very high. A first gas is applied in cycles with a second gas such that a cumulative time duration of the first and second gases form a relatively thick $SiO_2$ protective film on the sidewall. In a second session, the use ratio is changed so as to favor the second gas with respect to the first gas so as to widen the bottom part of the hole (i.e., increase the bottom CD) while preventing bowing. Control over the A/R for relatively deep holes can be achieved this way. As can be seen in the SEMs of FIGS. 5A and 5B, the CD was more uniform when the above-described process was employed. FIG. 5A shows the new approach of the present disclosure, whereas FIG. 5B shows the result of a conventional etch —$O_2$/COS. In FIG. 5B, the hole bows below the Si-ARC (mask), and then tapers toward the bottom. Whereas the top/center/bottom CD are more uniform in the FIG. 5A.

The advantages include the flexibility with which we can have desirable shape or dimension of the pattern through the control of the frequency of precursor introduction. This method is basically applicable to various patterns. The $SiO_2$ film with a high etching selectivity in the organic-film etching can be used as a protective layer. Since, the $SiO_2$ layer is formed thin, the possibility of the hole clogging can be reduced. As the protective layer is formed through self-limited reaction, the thickness of the formed film can be uniform across the substrate. Since, the protective layer is formed through self-limited reaction, it can be formed in a high A/R pattern, and as a result, this process realizes high controllability of the formed pattern.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A method of processing a substrate comprising:
   etching and forming a recess in the substrate to form a pattern of the substrate;
   in a first session, performing a hybrid gas application cycle in a chamber that holds the substrate having the recess formed therein, including
   introducing a first gas as a precursor for a first time period in the chamber so the precursor adsorbs onto sidewalls of the pattern of the substrate, and
   subsequently, introducing a second gas as a reaction gas for a second time period in a condition so the reaction gas reacts with the precursor to provide a protective layer on the sidewalls of the pattern of the substrate and, at the same time, the reaction gas etches away the protective layer and a portion of the substrate at a bottom portion of the pattern so that the protective layer is formed only on the sidewalls of the pattern, a ratio of the first time period to the second time period being a use-ratio; and
   in a second session, repeating the hybrid gas application cycle with a different use-ratio that corresponds with a vertical dimension of the pattern.

2. The method of claim 1, wherein the precursor is a silicon-containing gas, and the reaction gas is an oxygen radical gas.

3. The method of claim 1, wherein the pattern is a hole and the use-ratio for the first session is set to be less than the different use-ratio for the second session so as to form the hole with a tapered shape.

4. The method of claim 1, wherein the pattern is a hole and the use-ratio used in the first session is set to be greater than the different use-ratio for the second session so as to form the hole with wider dimension toward a bottom of the hole.

5. The method of claim 1, further comprising:
   in the first session, repeating the hybrid gas application cycle while maintaining the use-ratio.

6. The method of claim 1, further comprising:
   performing a third session by repeating the hybrid gas application cycle with a greater use-ratio than the use-ratio of the first session and the different use-ratio of the second session.

7. The method of claim 6, wherein a number of hybrid gas application cycles performed in the first session is greater than that for the second session, and the use-ratio in the first session is greater than the different use-ratio in the second session.

8. The method of claim 7, wherein a number of hybrid gas application cycles performed in the second session is greater than that for the third session, and the different use-ratio in the second session is greater than that for the third session.

9. The method of claim 1, wherein the hybrid gas application cycle includes applying at least one of the first gas or the second gas as a plasma.

10. The method of claim 1, wherein the introducing a second gas comprises introducing the second gas after a predetermined time after the first time period has elapsed.

11. The method of claim 1, further comprising:
    in the first session, performing an intermediate step between the introducing the first gas and the introducing the second gas.

12. The method of claim 1, wherein the chamber used in the step of introducing the first gas is a different chamber than that used in the step of introducing the second gas.

13. The method of claim 1, wherein the second gas is an O-containing gas.

14. The method of claim 1, wherein the use-ratio for the first session differs from the use-ratio for the second session by a factor of 1.5.

15. A method of processing a substrate comprising:
    etching and forming a recess in the substrate to form a pattern of the substrate;
    in a first session, performing a hybrid gas application cycle in a chamber that holds the substrate having the recess formed therein, including
    introducing a first gas as a precursor for a first time period in the chamber so the precursor absorbs onto sidewalls of the pattern of the substrate,
    subsequently, introducing a second gas as a reaction gas in a first condition so the reaction gas reacts with the precursor to provide a protective layer on the sidewalls of the pattern of the substrate, and
    subsequently introducing another reaction gas in a second condition for a second time period so as to etch away the protective layer and a portion of the substrate at a bottom portion of the pattern, a ratio of the first time period to the second time period being a use-ratio; and
    in a second session, repeating the hybrid gas application cycle with a different use-ratio that corresponds with a vertical dimension of the pattern so as to control a shape along the vertical dimension of the pattern,
    wherein the another reaction gas is different from the second gas and the second condition is different from the first condition.

16. The method of claim 15, further comprising:
    in the first session, repeating the hybrid gas application cycle while maintaining the use-ratio.

17. The method of claim 15, wherein the hybrid gas application cycle includes applying at least one of the first gas or the second gas as a plasma.

18. The method of claim 15, wherein the use-ratio for the first session differs from the use-ratio for the second session by a factor of 1.5.

* * * * *